United States Patent
Yeh et al.

(10) Patent No.: US 11,640,970 B2
(45) Date of Patent: May 2, 2023

(54) CAPACITOR STRUCTURE INCLUDING PATTERNED CONDUCTIVE LAYER DISPOSED BETWEEN TWO ELECTRODES AND MANUFACTURING METHOD THEREOF

(71) Applicant: UNITED MICROELECTRONICS CORP., Hsin-Chu (TW)

(72) Inventors: Chih-Tung Yeh, Taoyuan (TW); Kuang-Pi Lee, Taichung (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 18 days.

(21) Appl. No.: 17/359,655

(22) Filed: Jun. 28, 2021

(65) Prior Publication Data
US 2022/0384562 A1 Dec. 1, 2022

(30) Foreign Application Priority Data
May 31, 2021 (CN) .......................... 202110598854.4

(51) Int. Cl.
*H01L 27/06* (2006.01)
*H01L 49/02* (2006.01)

(52) U.S. Cl.
CPC .......... *H01L 28/60* (2013.01); *H01L 27/0605* (2013.01); *H01L 27/0629* (2013.01)

(58) Field of Classification Search
CPC .. H01L 28/60; H01L 27/0605; H01L 27/0629

USPC ......................................................... 257/532
See application file for complete search history.

(56) References Cited

U.S. PATENT DOCUMENTS

| | | | | |
|---|---|---|---|---|
| 2003/0178666 A1* | 9/2003 | Lee | .......................... | H01L 28/40 257/311 |
| 2004/0061177 A1* | 4/2004 | Merchant | ................ | H01L 28/60 257/349 |
| 2011/0198725 A1* | 8/2011 | Roest | .................. | H01L 27/0251 257/532 |
| 2015/0294936 A1* | 10/2015 | Shen | ................. | H01L 21/76877 257/532 |
| 2019/0013269 A1* | 1/2019 | Zhang | ............... | H01L 21/76831 |

FOREIGN PATENT DOCUMENTS

WO 2018/174872 A1 9/2018

\* cited by examiner

*Primary Examiner* — Duy T Nguyen
(74) *Attorney, Agent, or Firm* — Winston Hsu

(57) ABSTRACT

A capacitor structure includes an insulation layer and a capacitor unit disposed on the insulation layer. The capacitor unit includes a first electrode, a second electrode, a first dielectric layer, and a patterned conductive layer. The second electrode is disposed above the first electrode in a vertical direction. The first dielectric layer is disposed between the first electrode and the second electrode in the vertical direction. The patterned conductive layer is disposed between first electrode and the second electrode, the patterned conductive layer is electrically connected with the first electrode, and the first dielectric layer surrounds the patterned conductive layer in a horizontal direction.

10 Claims, 11 Drawing Sheets

CAPACITOR STRUCTURE INCLUDING PATTERNED CONDUCTIVE LAYER DISPOSED BETWEEN TWO ELECTRODES AND MANUFACTURING METHOD THEREOF

BACKGROUND OF THE INVENTION

1. Field of the Invention

The present invention relates to a capacitor structure and a manufacturing method thereof, and more particularly, to a capacitor structure including a patterned conductive layer disposed between two electrodes and a manufacturing method thereof.

2. Description of the Prior Art

In modern society, the micro-processor systems composed of integrated circuits (ICs) are applied popularly in our living. Many electrical products, such as personal computers, mobile phones, and home appliances, include ICs. With the development of technology and the increasingly imaginative applications of electrical products, the design of ICs tends to be smaller, more delicate and more diversified. In the recent electrical products, IC devices, such as metal oxide semiconductor (MOS) transistors, capacitors, or resistors, are produced from silicon based substrates that are fabricated by semiconductor manufacturing processes. A complicated IC system may be composed of the IC devices electrically connected with one another. Generally, a capacitor structure may be composed of a top electrode, a dielectric layer, and a bottom electrode. The capacitor structure is traditionally disposed in an inter-metal dielectric (IMD) layer on a silicon based substrate and includes a metal-insulator-metal (MIM) capacitor structure.

However, as the function and performance demands of electronic products continue to increase, the complexity and integration of integrated circuits have also increased relatively. Therefore, how to integrate the capacitor structure and the manufacturing methods of other components (such as transistors) and/or integrate structural design to meet product requirements has always been the research direction of the related fields.

SUMMARY OF THE INVENTION

A capacitor structure and a manufacturing method thereof are provided in the present invention. A dielectric layer and a patterned conductive layer are disposed between two electrodes of a capacitor unit, and the dielectric layer surrounds the patterned conductive layer for simplifying related manufacturing processes of the capacitor unit and improving process integration between the capacitor unit and other semiconductor units.

According to an embodiment of the present invention, a capacitor structure is provided. The capacitor structure includes an insulation layer and a capacitor unit, and the capacitor unit is disposed on the insulation layer. The capacitor unit includes a first electrode, a second electrode, a first dielectric layer, and a patterned conductive layer. The second electrode is disposed above the first electrode in a vertical direction. The first dielectric layer is disposed between the first electrode and the second electrode in the vertical direction. The patterned conductive layer is disposed between first electrode and the second electrode. The patterned conductive layer is electrically connected with the first electrode, and the first dielectric layer surrounds the patterned conductive layer in a horizontal direction.

According to an embodiment of the present invention, a manufacturing method of a capacitor structure is provided. The manufacturing method includes the following steps. A capacitor unit is formed on an insulation layer. The capacitor unit includes a first electrode, a second electrode, a dielectric layer, and a patterned conductive layer. The second electrode is disposed above the first electrode in a vertical direction. The dielectric layer is disposed between the first electrode and the second electrode in the vertical direction. The patterned conductive layer is disposed between first electrode and the second electrode. The patterned conductive layer is electrically connected with the first electrode, and the dielectric layer surrounds the patterned conductive layer in a horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of a capacitor structure according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
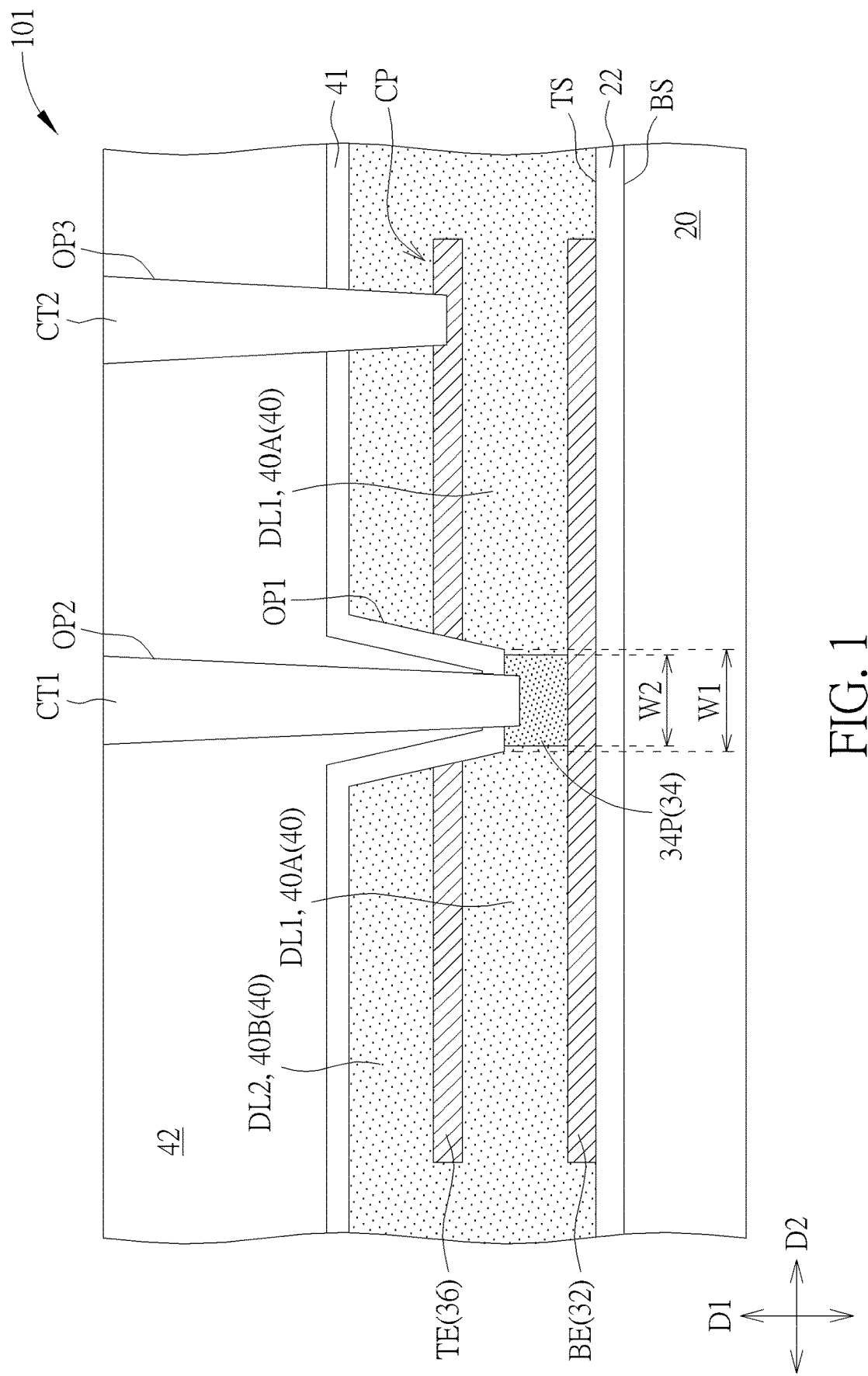
FIG. 1 is a schematic drawing illustrating a capacitor structure according to a first embodiment of the present invention.

Please refer to FIG. 1. FIG. 1 is a schematic drawing illustrating a capacitor structure 101 according to a first embodiment of the present invention. As shown in FIG. 1, the capacitor structure 101 includes an insulation layer 22 and a capacitor unit CP. The capacitor unit CP is disposed on the insulation layer 22, and the capacitor unit CP includes a first electrode BE, a second electrode TE, a first dielectric layer DL1, and a patterned conductive layer 34P. The second electrode TE is disposed above the first electrode BE in a vertical direction (such as a first direction D1 shown in FIG. 1). The first dielectric layer DL1 is disposed between the first electrode BE and the second electrode TE in the first direction D1, and the patterned conductive layer 34P is disposed between first electrode BE and the second electrode TE. The patterned conductive layer 34P is electrically connected with the first electrode BE, and the first dielectric layer DL1 surrounds the patterned conductive layer 34P in a horizontal direction (such as a second direction D2 shown in FIG. 1 or other directions perpendicular to the first direction D1). By disposing the patterned conductive layer 34P, a part of the patterned conductive layer 34P may be removed for forming a gap between the first electrode BE and the second electrode TE, and the first dielectric layer DL1 may be disposed in the gap for forming the capacitor unit CP. Therefore, the manufacturing process of the capacitor unit CP may be integrated with a manufacturing process of a dielectric layer in other components (such as transistors) for improving the design flexibility of related structure integration and/or manufacturing process integration.

In some embodiments, the first direction D1 described above may be regarded as a thickness direction of the insulation layer 22. The insulation layer 22 may have a top surface TS and a bottom surface BS opposite to the top surface TS in the first direction D1, and the capacitor unit CP may be disposed at a side of the top surface TS, but not limited thereto. Horizontal directions substantially orthogonal to the first direction D1 (such as the second direction D2 shown in FIG. 1 and other directions perpendicular to the first direction D1) may be substantially parallel with the top surface TS and/or the bottom surface BS of the insulation layer 22, but not limited thereto. Additionally, in this description, a distance between the bottom surface BS of the insulation layer 22 and a relatively higher location and/or a relatively higher part in the vertical direction (such as the first direction D1) is greater than a distance between the bottom surface BS of the insulation layer 22 and a relatively lower location and/or a relatively lower part in the first direction D1. The bottom or a lower portion of each component may be closer to the bottom surface BS of the insulation layer 22 in the first direction D1 than the top or upper portion of this component. Another component disposed above a specific component may be regarded as being relatively far from the bottom surface BS of the insulation layer 22 in the first direction D1, and another component disposed under a specific component may be regarded as being relatively closer to the bottom surface BS of the insulation layer 22 in the first direction D1, but not limited thereto.

In some embodiments, the patterned conductive layer 34P may be directly connected with the first electrode BE physically and electrically, the patterned conductive layer 34P may be separated from the second electrode TE physically and electrically, and the first dielectric layer DL1 may directly contact the first electrode BE, the second electrode TE, and the patterned conductive layer 34P, but not limited thereto. In some embodiments, when viewed in the first direction D1, the first electrode BE may overlap the second electrode TE in the first direction D1, and an area of the part of the first electrode BE overlapping the second electrode TE in the first direction D1 may be substantially equal to a projection area of the second electrode TE in the first direction D1, but not limited thereto. Additionally, in some embodiments, when viewed in the first direction D1, a center point of the projection area of the first electrode BE in the first direction D1 may overlap the patterned conductive layer 34P in the first direction D1, and the first dielectric layer DL1 disposed between the first electrode BE and the second electrode TE may be located at two opposite sides of the patterned conductive layer 34P in the horizontal direction (such as the second direction D2), but not limited thereto.

In some embodiments, the material of the first electrode BE and the material of the second electrode TE may respectively include titanium (Ti), titanium nitride (TiN), tantalum (Ta), tantalum nitride (TaN), or other suitable electrically conductive materials. In addition, the material composition of the patterned conductive layer 34P different from the material composition of the first electrode BE and the material composition of the second electrode TE because the etching selectivity between the patterned conductive layer 34P and the first electrode BE and between the patterned conductive layer 34P and the second electrode TE in the specific etching process is required for removing a part of the patterned conductive layer 34P so as to form a gap between the first electrode BE and the second electrode TE, and the first dielectric layer DL1 may then be formed in the gap for forming the capacitor unit CP. For example, the patterned conductive layer 34P may include aluminum, a compound containing aluminum, or other materials having required etching selectivity with the material of the first electrode BE and the material of the second electrode TE. When the material of the patterned conductive layer 34P is aluminum, the material of the first electrode BE and the second electrode TE may be titanium or titanium nitride, but not limited thereto.

In some embodiments, the capacitor structure 101 may further include a second dielectric layer DL2 disposed on the insulation layer 22 and covering the capacitor unit CP, and a material composition of the second dielectric layer DL2 may be identical to the material composition of the first dielectric layer DL1. In some embodiments, the second dielectric layer DL2 may cover the capacitor unit CP in the vertical direction and the horizontal direction, and the second dielectric layer DL2 may be directly connected with the first dielectric layer DL1. For example, the first dielectric layer DL1 may be a first portion 40A of a dielectric material 40, the second dielectric layer DL2 may be a second portion 40B of the dielectric material 40, and the second portion 40B may be directly connected with the first portion 40A. The dielectric layer 40 may include a silicon oxide layer, such as a tetra-ethyl-ortho-silicate (TEOS) based silicon oxide layer with TEOS used as a precursor or other dielectric materials having great gap-filling capability and/or high dielectric constant (high-k) for increasing the capacitance of the capacitor unit CP, but not limited thereto.

In some embodiments, the capacitor structure 101 may further include an opening OP1 and a contact structure CT1. The opening OP1 may be disposed above the patterned conductive layer 34P in the first direction D1 and penetrate through the second dielectric layer DL2 located on the second electrode TE, the second electrode TE, and a part of the first dielectric layer DL1 in the first direction D1, and a bottom portion of the opening OP1 may be connected with the patterned conductive layer 34P. In addition, the contact structure CT1 may be partly disposed in the opening OP1 and electrically connected with the first electrode BE via the patterned conductive layer 34P. In some embodiments, the capacitor structure 101 may further include a liner layer 41, a dielectric material 42, and a contact structure CT2. The liner layer 41 may be disposed on the second dielectric layer DL2 and partly disposed in the opening OP1, and the dielectric material 42 may be disposed on the liner layer 41 and partly disposed in the opening OP1. Therefore, a part of the liner layer 41 and a part of the dielectric material 42 may be disposed on the patterned conductive layer 34P in the first direction Dl. In addition, an opening OP2 may penetrate through the dielectric material 42 and the liner layer 41 located on the patterned conductive layer 34P in the first direction D1, and another opening OP3 may penetrate through the dielectric material 42, the liner layer 41, and the second dielectric layer DL2 located on the second electrode TE in the first direction D1. The contact structure CT1 and the contact structure CT2 may be disposed in the opening OP2 and the opening OP3, respectively. The contact structure CT1 may contact and be electrically connected with the patterned conductive layer 34P, the contact structure CT2 may contact and be electrically connected with the second electrode TE, and the opening OP2 may be partly located in the opening OP1. In some embodiments, a part of the liner layer 41 and/or a part of the dielectric material 42 may be located between the contact structure CT1 and the second electrode TE in the horizontal direction (such as the second direction D2) for electrically isolating the contact structure CT1 from the second electrode TE.

In some embodiments, the insulation layer 22 may include silicon oxide, silicon nitride, silicon oxynitride, or other suitable insulation materials. The liner layer 41 may include nitride (such as silicon nitride) or other suitable insulation materials. The dielectric material 42 may include silicon oxide, a low dielectric constant (low-k) dielectric material, or other suitable dielectric materials. The low-k dielectric material described above may be used to reduce the electrical influence between the contact structure CT1 and the contact structure CT2, the material composition of the dielectric material 42 may be different from the material composition of the dielectric material 40 accordingly, and the dielectric constant of the dielectric material 42 may be lower than the dielectric constant of the dielectric material 40, but not limited thereto. Additionally, the contact structure CT1 and the contact structure CT2 may include a barrier layer (not illustrated) and a low electrical resistivity material layer (not illustrated). The barrier layer may include titanium nitride, tantalum nitride, or other suitable electrical conductive barrier materials, and the low electrical resistivity material may include a material having relatively low electrical resistivity, such as copper, aluminum, and tungsten, but not limited thereto.

In some embodiments, the capacitor structure 101 may further include a III-V compound layer 20, and the insulation layer 22 may be disposed on the III-V compound layer 20 in the first direction D1. In some embodiments, a part of the III-V compound layer 20 may be used as a portion of a III-V compound transistor structure (such as a gallium nitride transistor), and the III-V compound layer 20 may include multiple III-V compound layers (such as gallium nitride semiconductor layer, aluminum gallium nitride layer, and so forth) stacked in the first direction D1, but not limited thereto. In some embodiments, the manufacturing process of the first dielectric layer DL1 in the capacitor unit CP and the second dielectric layer DL2 covering the capacitor unit CP may be integrated with a manufacturing process of a dielectric layer in the III-V compound transistor structure or a dielectric layer on the III-V compound transistor structure for process simplification, but not limited thereto. In some embodiments, the structure and/or the manufacturing process of the capacitor unit CP described above may also be integrated with the structure and/or the manufacturing process of other kinds of active devices and/or passive devices according to some design considerations.

Figure 2:
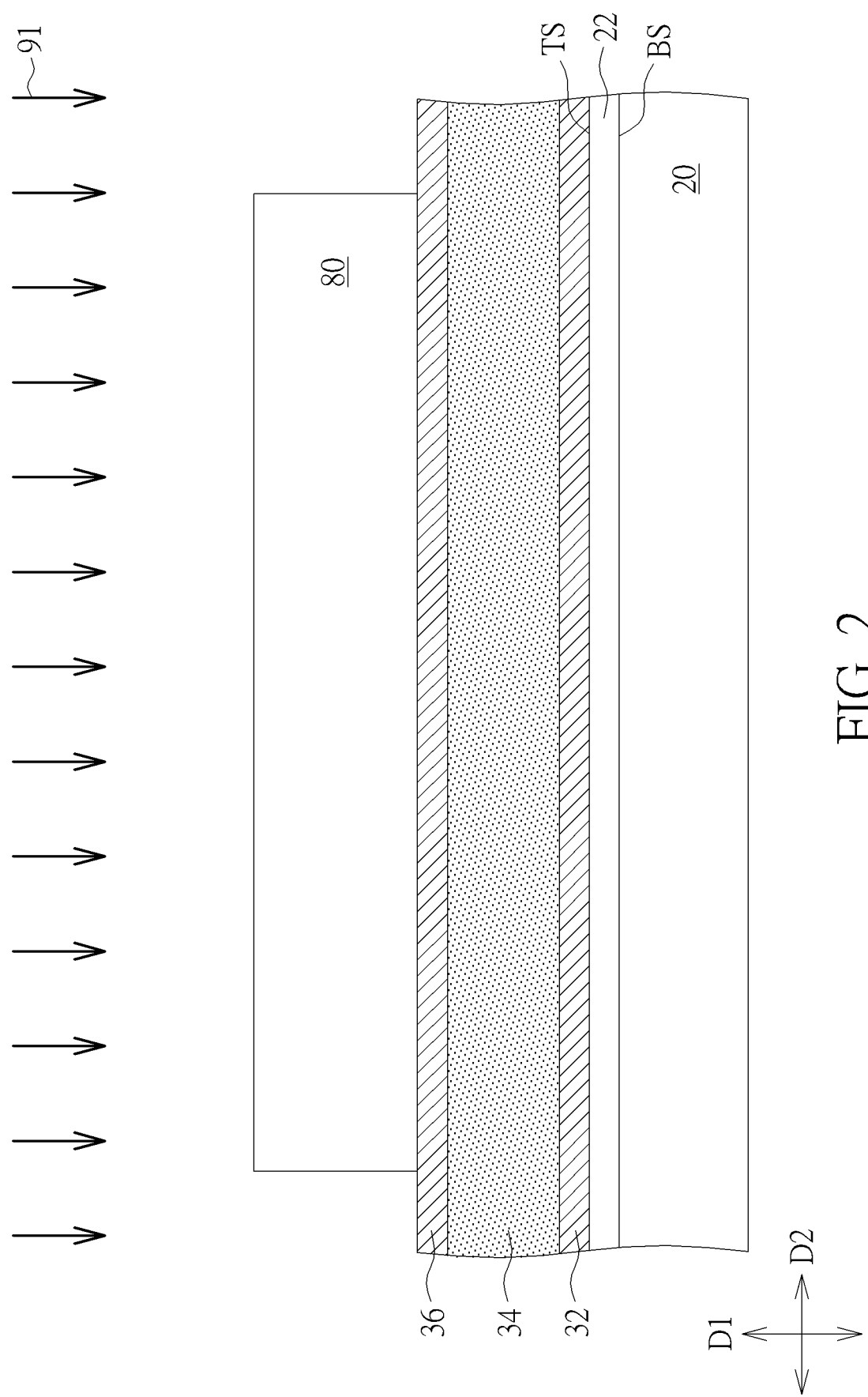
Figure 3:
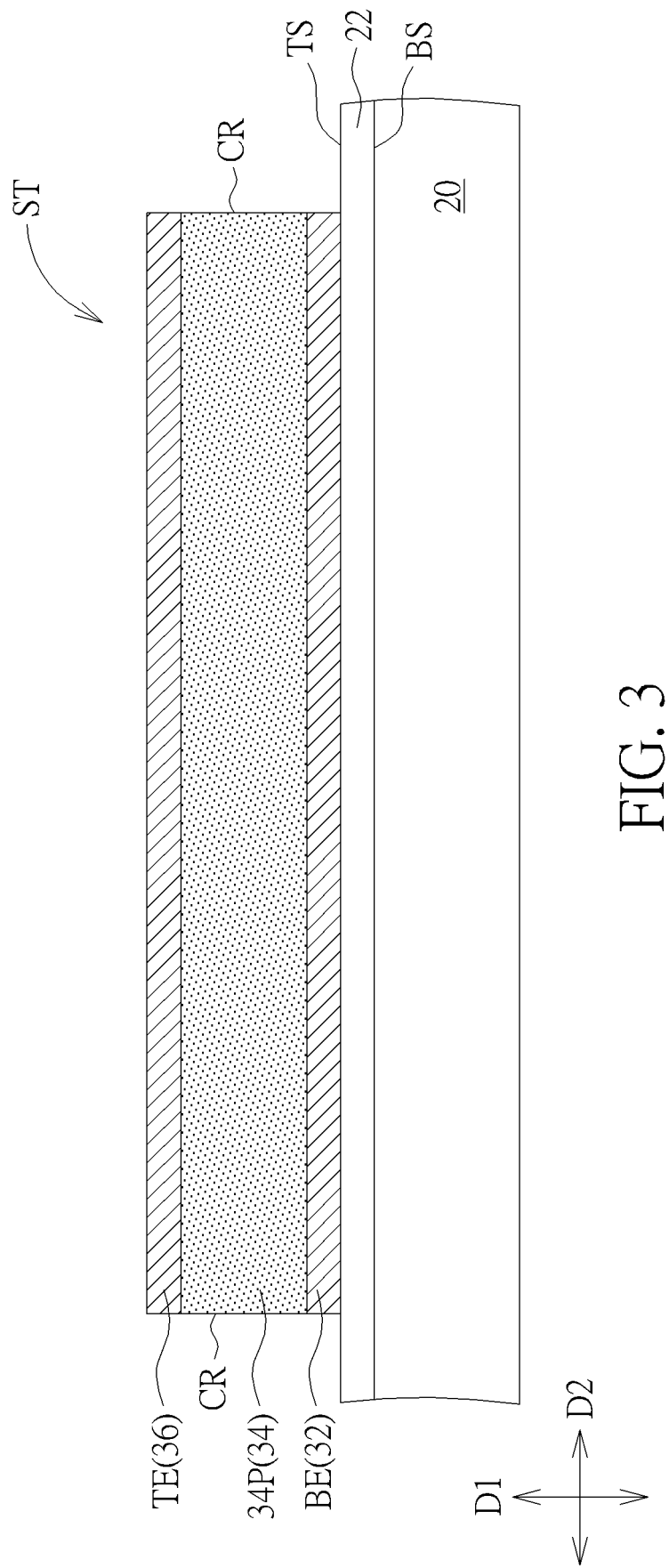
Figure 4:
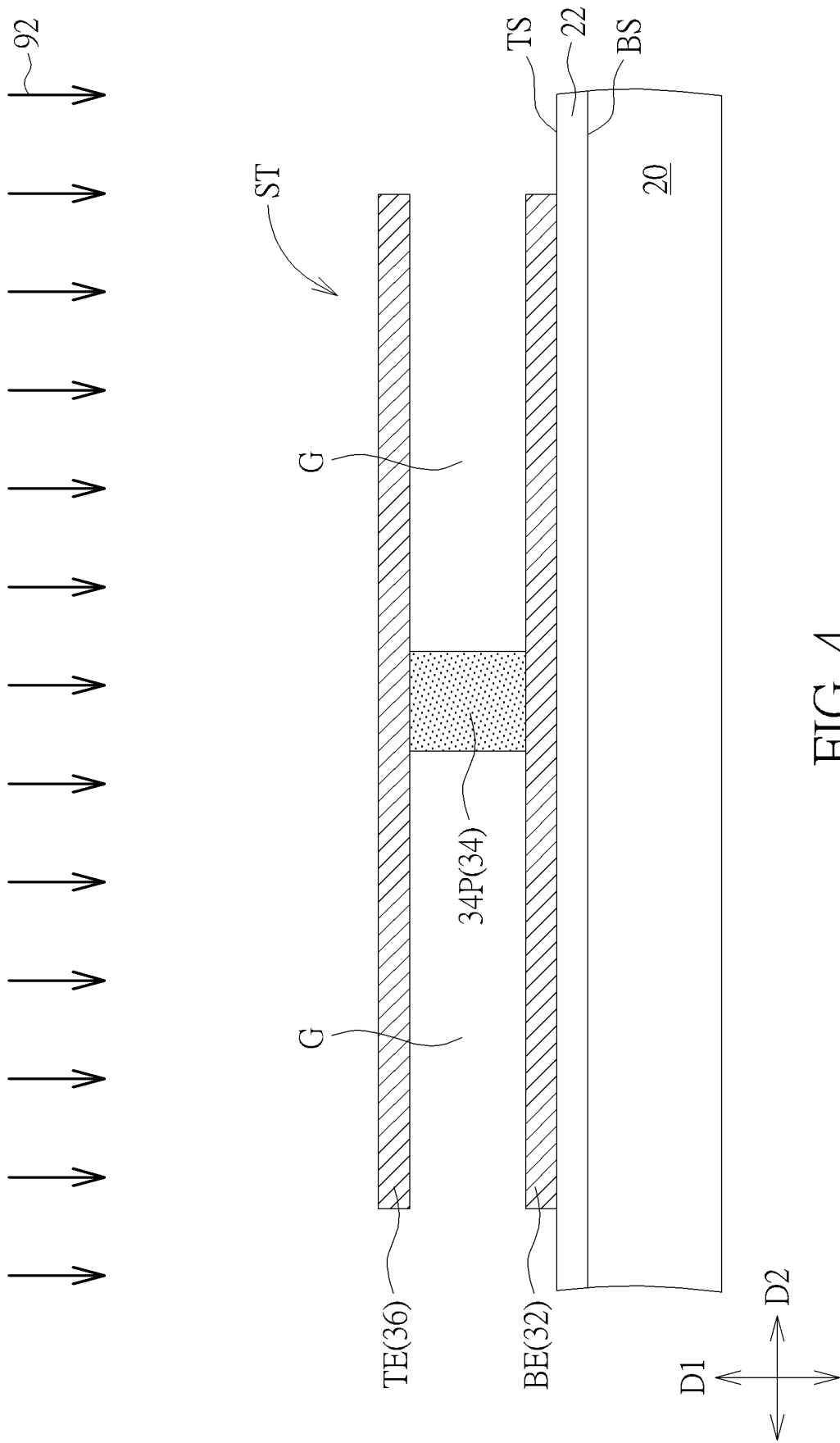
Figure 5:
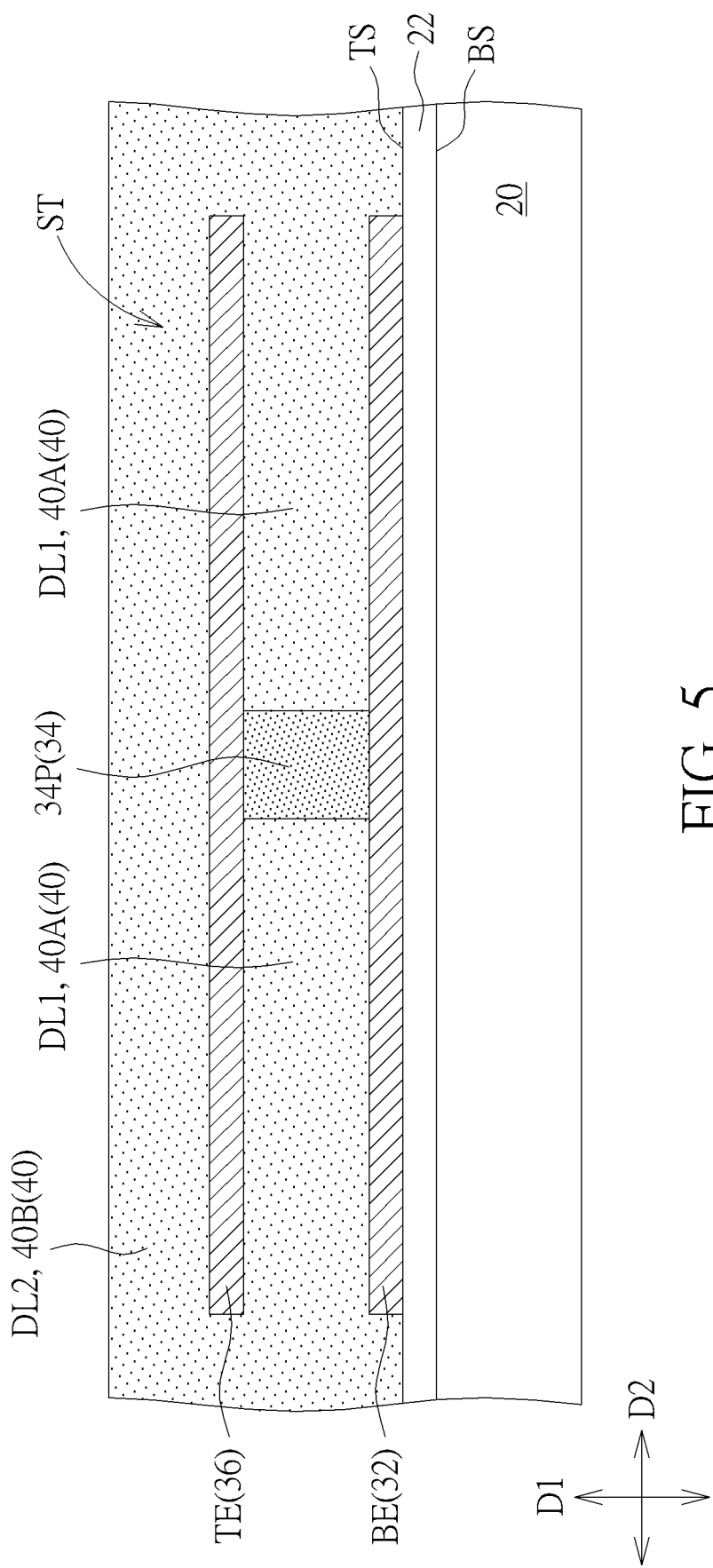
Figure 6:
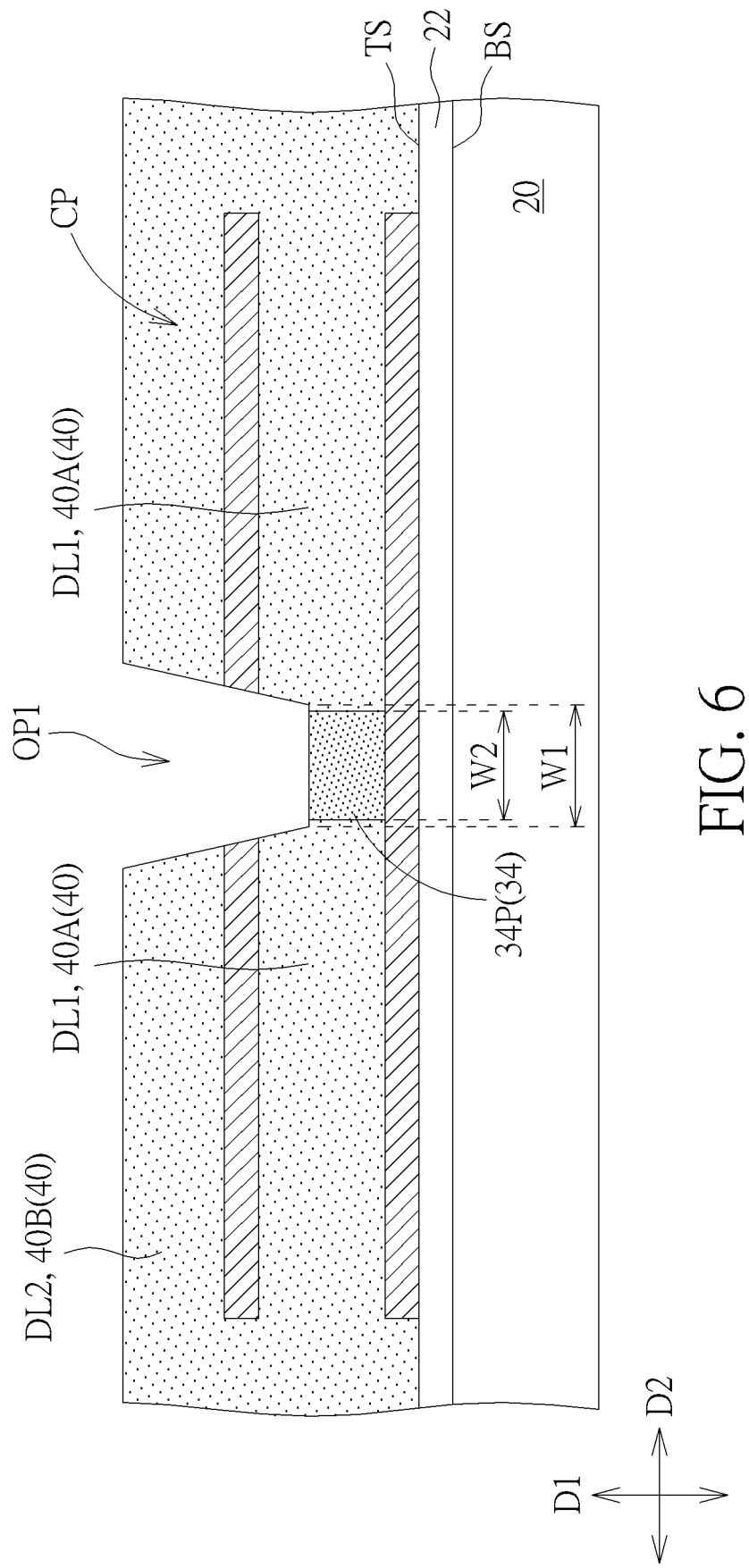
Figure 7:
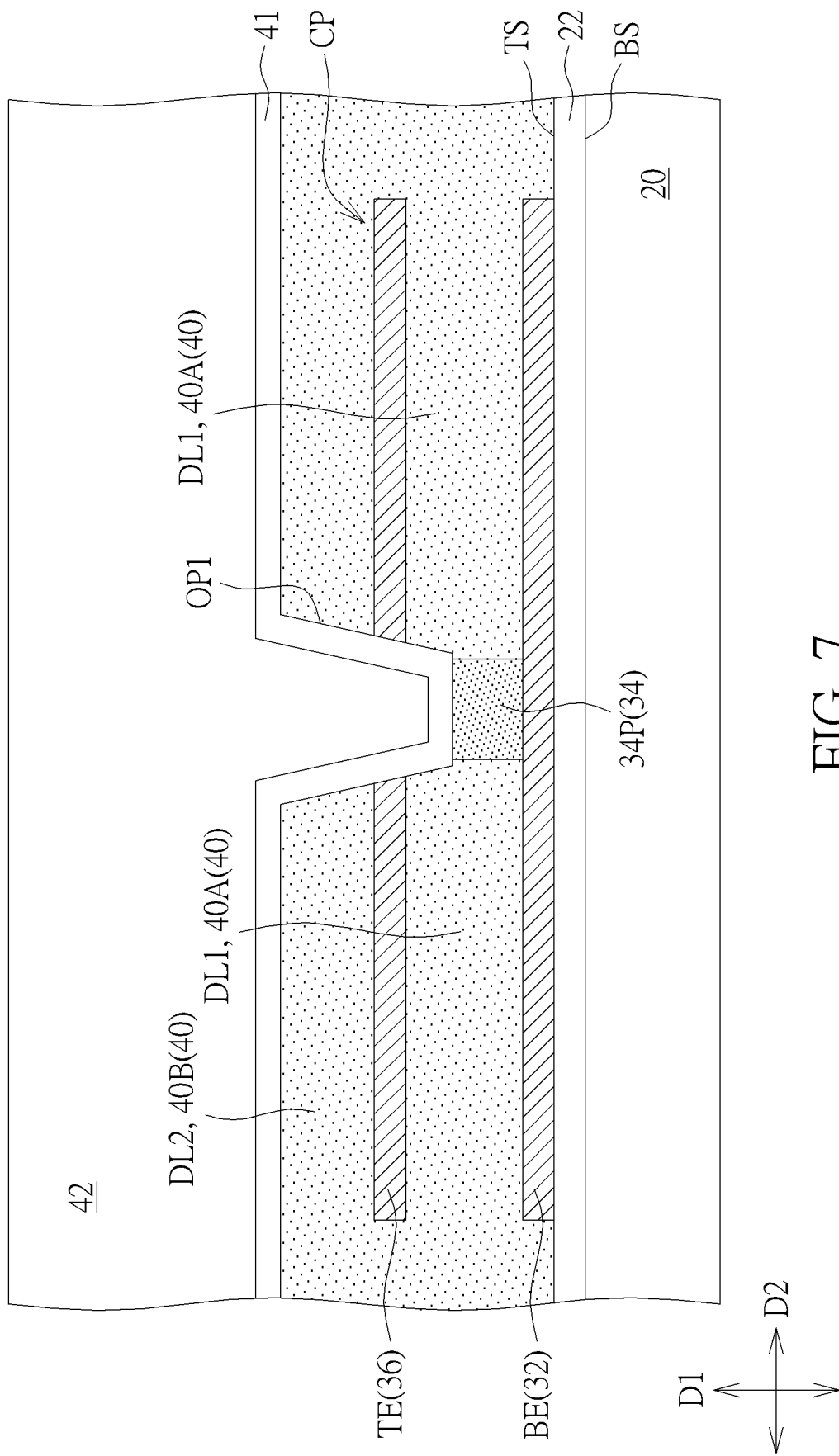

Please refer to FIGS. 2-7 and FIG. 1. FIGS. 2-7 are schematic drawings illustrating a manufacturing method of a capacitor structure according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 1 may be regarded as a schematic drawing in a step subsequent to FIG. 7, but not limited thereto. As shown in FIG. 1, the manufacturing method of the capacitor structure 101 may include the following steps. The capacitor unit CP is formed on the insulation layer 22. The capacitor unit CP includes the first electrode BE, the second electrode TE, the first dielectric layer DL1, and the patterned conductive layer 34P. The second electrode TE is disposed above the first electrode BE in a vertical direction (such as the first direction D1). The first dielectric layer DL1 is disposed between the first electrode BE and the second electrode TE in the first direction D1. The patterned conductive layer 34P is disposed between first electrode BE and the second electrode TE. The patterned conductive layer 34P is electrically connected with the first electrode BE, and the first dielectric layer DL1 surrounds the patterned conductive layer 34P in a horizontal direction (such as the second direction D2).

Specifically, the manufacturing method of the capacitor structure 101 in this embodiment may include but is not limited to the following steps. Firstly, as shown in FIG. 2 and FIG. 3, a stacked structure ST may be formed on the insulation layer 22, and the stacked structure ST may include the first electrode BE, the patterned conductive layer 34P, and the second electrode TE. In some embodiments, the step of forming the stacked structure ST may include but is not limited to the following steps. A first conductive layer 32 is formed on the insulation layer 22, a second conductive layer 34 is formed on the first conductive layer 32, and a third conductive layer 36 is formed on the second conductive layer 34. Subsequently, a patterning process 91 is performed to the third conductive layer 36, the second conductive layer 34, and the first conductive layer 32. At least a part of the third conductive layer 36 may be patterned to be the second electrode TE by the patterning process 91, at least a part of the second conductive layer 34 may be patterned to be the patterned conductive layer 34P by the patterning process 91, and at least a part of the first conductive layer 32 may be patterned to be the first electrode BE by the patterning process 91. In some embodiments, a patterned mask layer 80 may be formed on the third conductive layer 36, the patterning process 91 may be performed using the patterned mask layer 80 as an etching mask, and the patterning process 91 may include a single or a plurality of etching steps for etching the third conductive layer 36, the second conductive layer 34, and the first conductive layer 32, respectively, but not limited thereto. In some embodiments, the first electrode BE, the patterned conductive layer 34P, and the second electrode TE in the stacked structure ST may overlap one another in the first direction D1 have substantially the same projection area because the first electrode BE, the patterned conductive layer 34P, and the second electrode TE in the stacked structure ST may be formed by etching with the patterned mask layer 80, but not limited thereto. In addition, the patterned mask layer 80 may be removed after the stacked structure ST is formed.

Subsequently, as shown in FIGS. 2-4, a part of the patterned conductive layer 34P may be removed by an etching process 92 for forming a gap (such as an air gap) G between the first electrode BE and the second electrode TE. In some embodiments, the etching process 92 may include removing the part of the patterned conductive layer 34P by water (such as de-ionized water, DI water) reacting with a chloride residue CR on the stacked structure ST for forming the gap G For example, when the material of the patterned conductive layer 34P is aluminum or a compound containing aluminum, the chloride residue CR may include aluminum chloride (such as $AlCl_3$), the aluminum chloride may react with the water so as to form hydrogen chloride (HCl), and the hydrogen chloride may react with aluminum of the patterned conductive layer 34P so as to form aluminum chloride. Therefore, the reaction mechanism described above may be applied for etching the patterned conductive layer 34P, but not limited thereto. In some embodiments, other suitable etching approaches having required etching selectivity between the patterned conductive layer 34P and the first electrode BE and between the patterned conductive layer 34P and the second electrode TE may also be applied to form the gap G according to some design considerations. Additionally, in some embodiments, the patterning process 91 may include dry etching steps, the chloride residue CR described above may be generated by the patterning process 91, and gas used in the patterning process 91 (such as reaction gas used in the dry etching step) may include chlorine-containing gas, but not limited thereto. It is worth noting that, after the step of forming the gap the remaining patterned conductive layer 34P still has to directly contact the first electrode BE and the second electrode TE for supporting the second electrode TE.

As shown in FIGS. 4-6, the first dielectric layer DL1 may be formed in the gap G In some embodiments, the method of forming the dielectric layer may include forming the dielectric material 40 on the insulation layer 22. A part of the dielectric material 40 (such as the first portion 40A) may be formed in the gap and another part of the dielectric material 40 (such as the second portion 40B) may be formed on the stacked structure ST. The first dielectric layer DL1 may include the dielectric material 40 formed in the gap G (such as the first portion 40A of the dielectric material 40), and the second portion 40B of the dielectric material 40 may be regarded as the second dielectric layer DL2, but not limited thereto. After the step of forming the dielectric material 40, the opening OP1 may be formed above the patterned conductive layer 34P. The opening OP1 may penetrate through the dielectric material 40 on the stacked structure ST and the second electrode TE in the first direction D1, and a part of the patterned conductive layer 34P may be removed by the step of forming the opening OP1 for separating the patterned conductive layer 34P from the second electrode TE. In other words, the patterned conductive layer 34P may be directly connected with the second electrode TE after the step of forming the dielectric material 40 and before the step of forming the opening OP1, and the patterned conductive layer 34P may be separated from the second electrode TE after the step of forming the opening OP1 for forming the capacitor unit CP. In some embodiments, for removing the part of the patterned conductive layer 34P and keeping the patterned conductive layer 34P from being electrically connected with the second electrode TE, the bottom width of the opening OP1 (such as a width W1 shown in FIG. 6) may be greater than or equal to a width W2 of the patterned conductive layer 34P, but not limited thereto. It is worth noting that the manufacturing method of the capacitor unit CP in this embodiment may include but is not limited to the above-mentioned manufacturing steps corresponding to FIGS. 2-6, and other suitable manufacturing approaches may be applied to form the capacitor unit CP according to other design considerations. Additionally, when the capacitor unit CP is formed by the manufacturing steps corresponding to FIGS. 2-6 described above, the capacitance of the capacitor unit CP may be adjusted by changing the thickness of the second conductive layer 34. The demand for different product specifications of the capacitor unit CP may be satisfied without changing the corresponding layout patterns accordingly, and the cost of related design and/or manufacturing may be reduced.

As shown in FIG. 7, after the opening OP1 and the capacitor unit CP are formed, the liner layer 41 and the dielectric material 42 may be formed. The liner layer 41 may be formed conformally on the second dielectric layer DL2 and in the opening OP1, the dielectric material 42 may be formed on the liner layer 41, and the opening OP1 may be fully filled with the liner layer 41 and the dielectric material 42. As shown in FIG. 7 and FIG. 1, after the step of forming the dielectric material 42, the opening OP2, the opening OP3, the contact structure CT1, and the contact structure CT2 may be formed. In some embodiments, the liner layer 41 may be used as an etching stop layer in the step of forming the opening OP2 for improving the depth control of the opening OP2, but not limited thereto. In some embodiments, the dielectric material 42 may be formed right after the step of forming the opening OP1 without forming the liner layer 41.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
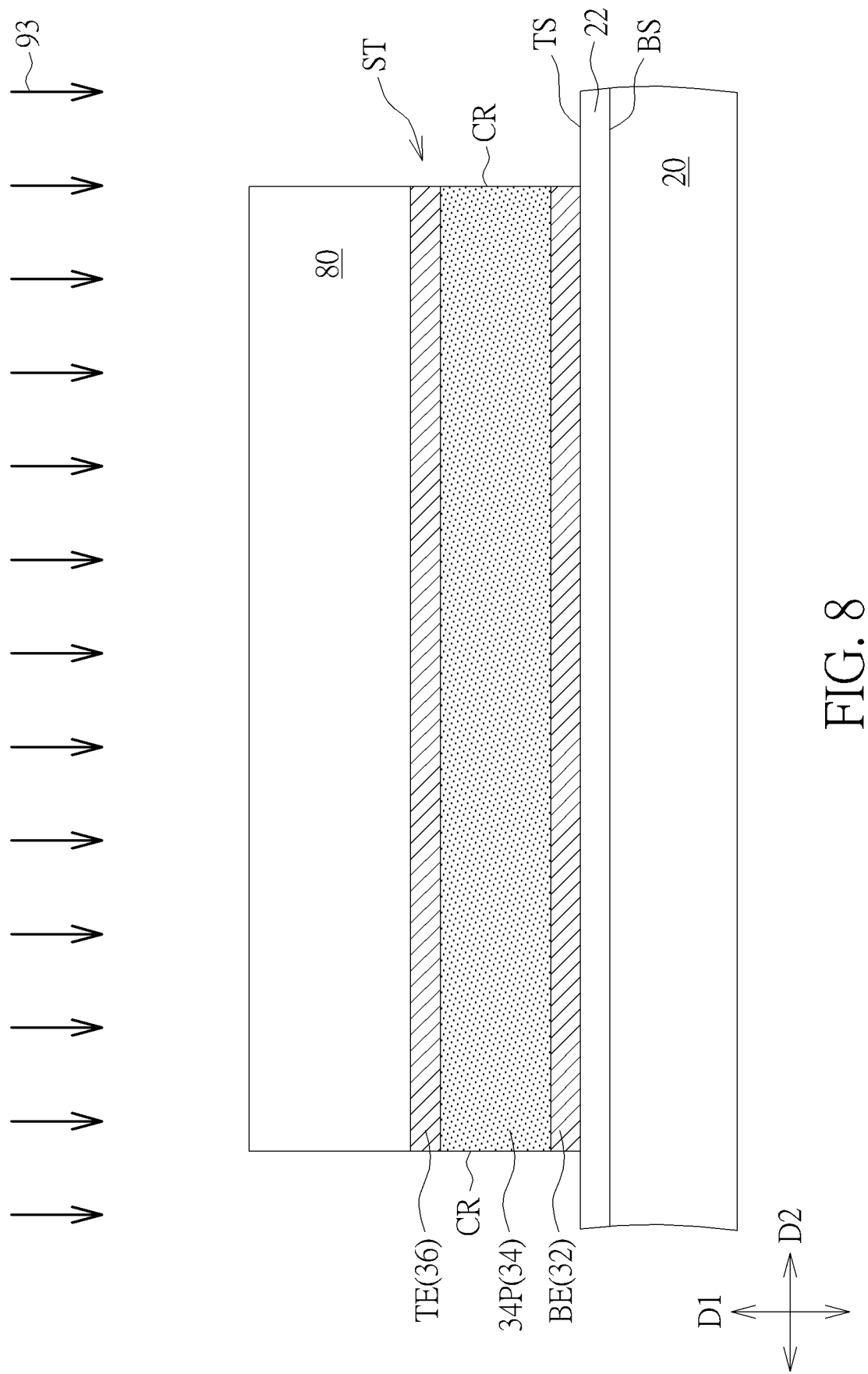
FIG. 8 is a schematic drawing illustrating a manufacturing method of a capacitor structure according to another embodiment of the present invention.

Please refer to FIG. 8 and FIGS. 2-4. FIG. 8 is a schematic drawing illustrating a manufacturing method of a capacitor structure according to another embodiment of the present invention. FIG. 8 may be regarded as a schematic drawing in a step subsequent to FIG. 2, and FIG. 3 may be regarded as a schematic drawing in a step subsequent to FIG. 8, but not limited thereto. As shown in FIG. 2 and FIG. 8, in some embodiments, a treatment 93 may be performed after the patterning process 91 (i.e. after the step of forming the stacked structure ST) for forming the chloride residue CR on the stacked structure ST, such as forming the chloride residue CR on the sidewall of the patterned conductive layer 34P, but not limited thereto. In some embodiments, the treatment 93 may include a plasma treatment or other suitable approaches capable of forming the chloride residue CR on the stacked structure ST, and the patterning process 91 and the treatment 93 may be carried out sequentially in the same process chamber, but not limited thereto. Subsequently, as shown in FIG. 8, FIG. 3, and FIG. 4, the patterned mask layer 80 may be removed after the treatment 93, and the etching process 92 may then be carried out for removing a part of the patterned conductive layer 34P and forming the gap G In other words, the treatment 93 may be performed after the patterning process 91 shown in FIG. 2 and before the etching process 92 shown in FIG. 4, and the chloride residue CR may be generated by the treatment 93.

Figure 9:
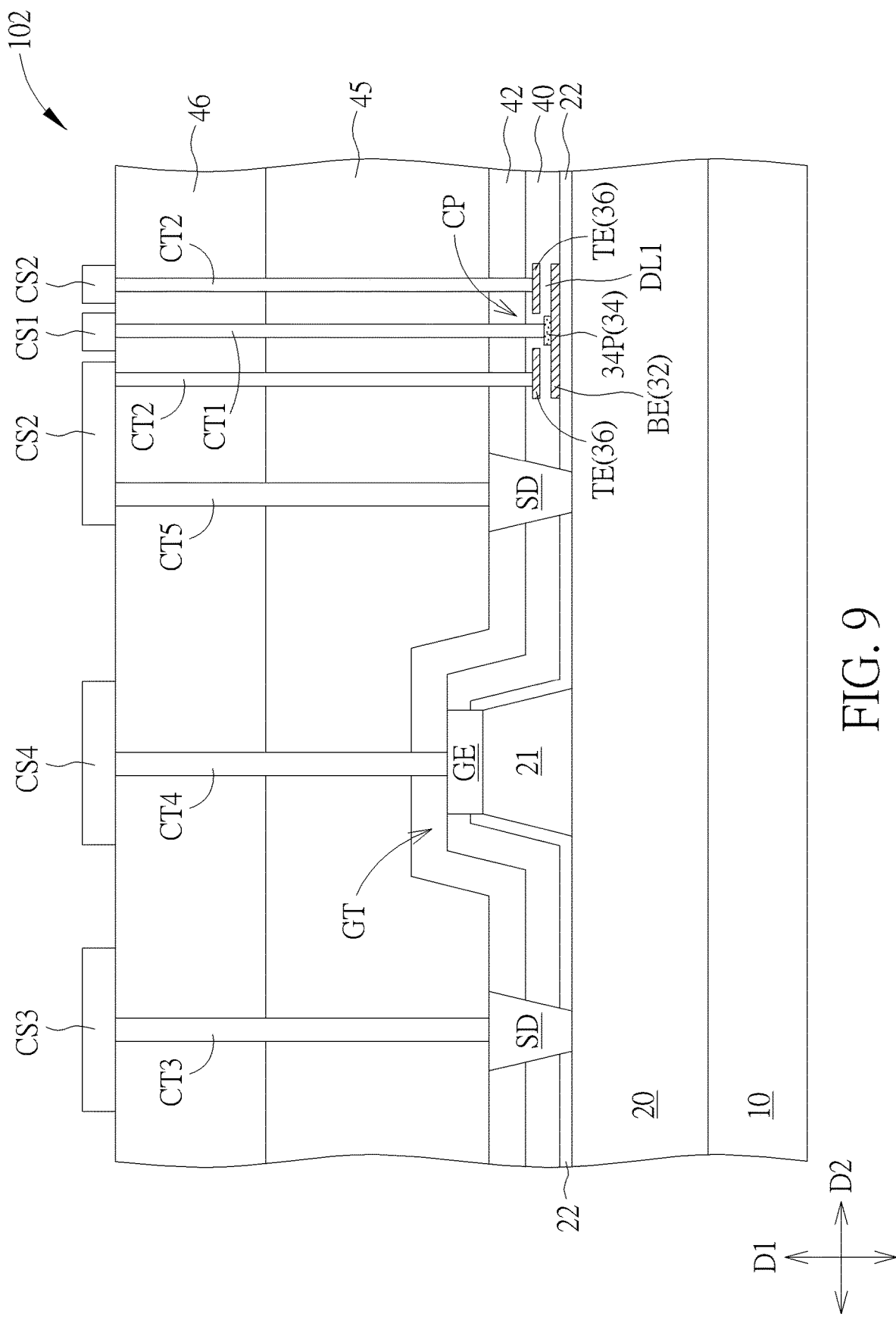
FIG. 9 is a schematic drawing illustrating a capacitor structure according to a second embodiment of the present invention.

Please refer to FIG. 9. FIG. 9 is a schematic drawing illustrating a capacitor structure 102 according to a second embodiment of the present invention. As shown in FIG. 9, in some embodiments, the capacitor structure 102 may further include a substrate 10, a III-V compound layer 21, source/drain structures SD, a gate structure GE, a dielectric material 45, and a dielectric material 46. In some embodiments, the III-V compound layer 20 may be disposed on the substrate 10, the III-V compound layer 21 may be disposed on the III-V compound layer 20, and the gate structure GE may be disposed on the III-V compound layer 21. The insulation layer 22 and the dielectric material 40 may be partly disposed on the sidewall of the III-V compound layer 21 and the sidewall of the gate structure GE, and the dielectric material 42 may be partly disposed on the gate structure GE. In addition, the source/drain structure SD may penetrate through the dielectric material 42, the dielectric material 40, and the insulation layer 22 for contacting the III-V compound layer 20. The dielectric material 45 may be disposed on the dielectric material 42, and the dielectric material 46 may be disposed on the dielectric material 45. In some embodiments, the substrate 10 may include a silicon substrate, a silicon carbide (SiC) substrate, a gallium nitride substrate, a sapphire substrate, or a substrate made of other suitable materials. The III-V compound layer 21 may include p-type doped III-V compound, such as p-type doped gallium nitride, the gate structure GE and the source/drain structure SD may respectively include metallic conductive material or other suitable conductive materials, and the dielectric material 45 and the dielectric material 46 may include a single layer or a plurality of dielectric material layers, but not limited thereto. In some embodiments, the gate structure GE, the source/drain structures SD, the III-V compound layer 21, and the III-V compound layer 20 may be regarded as a part of a transistor unit GT, and the dielectric material 40 may be partly disposed in the capacitor unit CP and partly disposed in the transistor unit GT for integrating the structure and/or the manufacturing process of the capacitor unit CP with that of the transistor unit GT, but not limited thereto. In some embodiments, the capacitor unit CP may be formed after the step of forming the III-V compound layer 21 and before the step of forming the gate structure GE, but not limited thereto.

In some embodiments, the capacitor structure 102 may further include a contact structure CT3, a contact structure CT4, a contact structure CTS, a connection structure CS1, a connection structure CS2, a connection structure CS3, and a connection structure CS4. The contact structure CS3 and the contact structure CT5 may penetrate through the dielectric material 45 and the dielectric material 46 located above the source/drain structures SD for being electrically connected with the corresponding source/drain structure SD, respectively. The contact structure CT4 may penetrate through the dielectric material 42, the dielectric material 45, and the dielectric material 46 located above the gate structure GE for being electrically connected with the gate structure GE. In addition, the contact structure CT1 may penetrate through the dielectric material 40, the dielectric material 42, the dielectric material 45, and the dielectric material 46 located above the patterned conductive layer 34P for being electrically connected with the patterned conductive layer 34P. The contact structure CT2 may penetrate through the dielectric material 40, the dielectric material 42, the dielectric material 45, and the dielectric material 46 located above the second electrode TE for being electrically connected with the second electrode TE. In addition, each of the connection structures described above may be disposed on the dielectric layer 46. The connection structure CS1, the connection structure CS3, and the connection structure CS4 may be electrically connected with the contact structure CT1, the contact structure CT3, and the contact structure CT4, respectively. The connection structure CS2 may be electrically connected with the contact structure CT2 and the contact structure CTS, and one of the source/drain structures SD in the transistor unit GT may be electrically connected with the second electrode TE of the capacitor unit CP via the contact structure CTS, the connection structure CS2, and the contact structure CT2 accordingly, but not limited thereto. In some embodiments, the material composition of the contact structure CT3, the contact structure CT4, and the contact structure CT5 may be similar to that of the contact structure CT1, and each of the connection structures described above may include a metallic conductive material or other suitable conductive materials.

Figure 10:
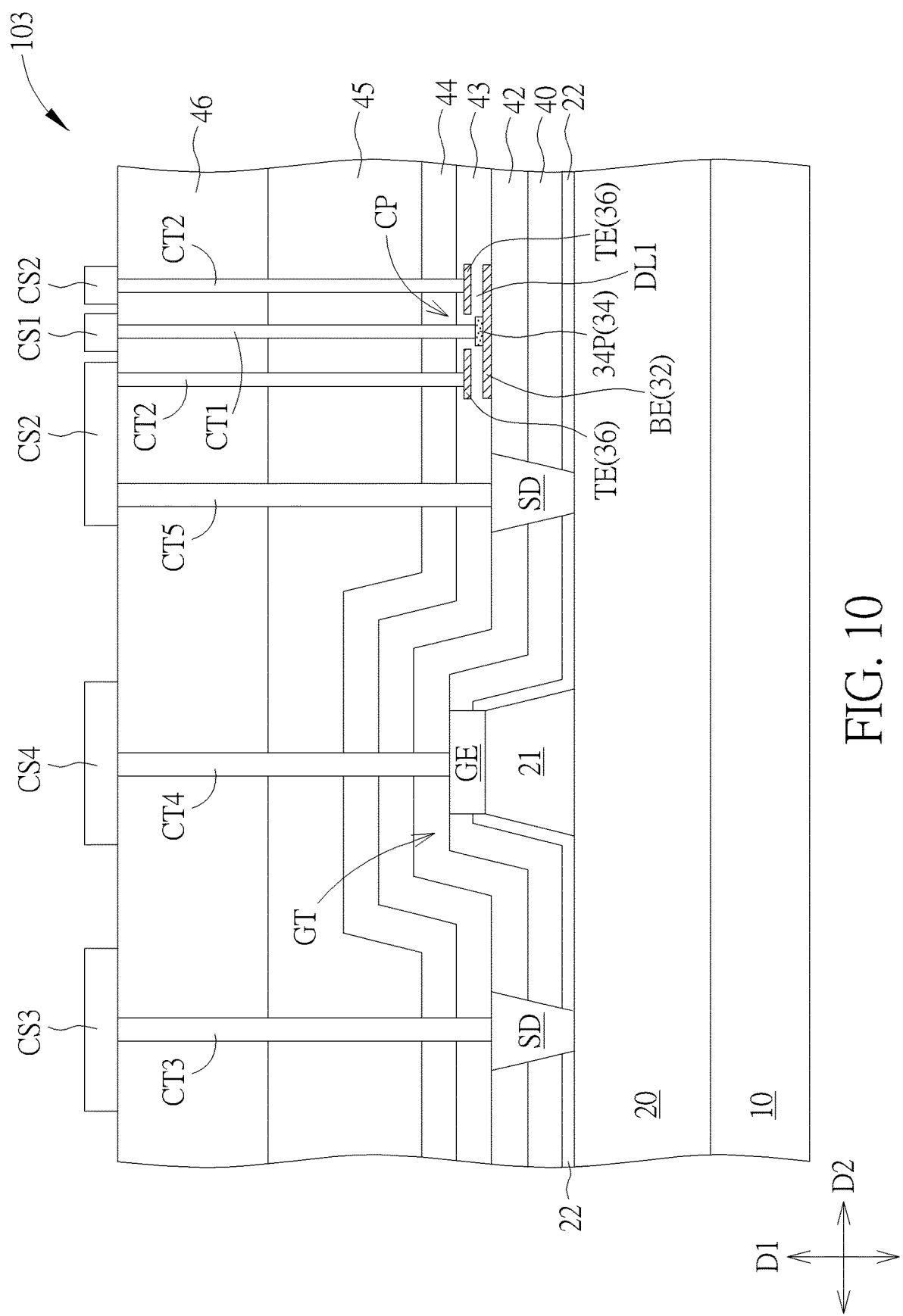
FIG. 10 is a schematic drawing illustrating a capacitor structure according to a third embodiment of the present invention.

Please refer to FIG. 10. FIG. 10 is a schematic drawing illustrating a capacitor structure 103 according to a third embodiment of the present invention. As shown in FIG. 10, in some embodiments, the capacitor structure 103 may further include a dielectric material 43 and a dielectric material 44. The dielectric material 43 and the dielectric material 44 may be disposed between the dielectric material 42 and the dielectric material 45, and the dielectric material 43 may be disposed between the dielectric material 42 and the dielectric material 44. In some embodiments, the capacitor unit CP may be disposed on the dielectric material 42, and a part of the dielectric material 43 may be used as the first dielectric layer DL1 in the capacitor unit CP. In some embodiments, the manufacturing process of the first electrode BE, the patterned conductive layer 34P, and/or the second electrode TE in the capacitor unit CP may be integrated with that of the source/drain structures SD for process simplification, but not limited thereto. In some embodiments, the first electrode BE, the patterned conductive layer 34P, and/or the second electrode TE in the capacitor unit CP may be formed on the dielectric layer 42 after the step of forming the source/drain structure SD. Additionally, in some embodiments, the dielectric material 43 may include silicon oxide, such as TEOS based silicon oxide, high-k dielectric material, or other suitable dielectric materials, and the dielectric material 44 may include oxide dielectric material, low-k dielectric material, or other suitable dielectric materials. Therefore, the dielectric constant of the dielectric material 43 may be higher than that of the dielectric material 44, but not limited thereto.

Figure 11:
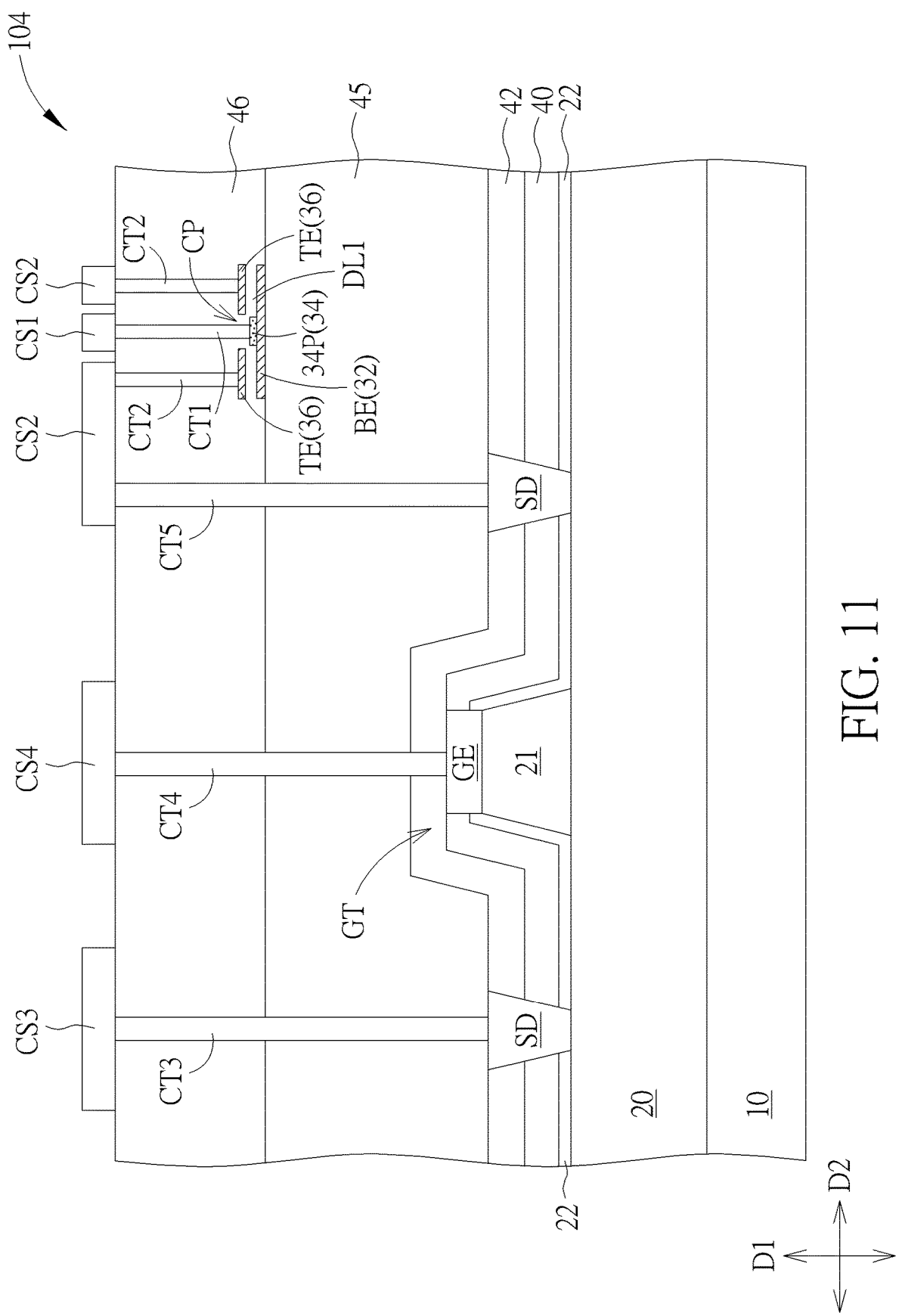
FIG. 11 is a schematic drawing illustrating a capacitor structure according to a fourth embodiment of the present invention.

Please refer to FIG. 11. FIG. 11 is a schematic drawing illustrating a capacitor structure 104 according to a fourth embodiment of the present invention. As shown in FIG. 11, in some embodiments, the capacitor unit CP may be disposed on the dielectric material 45, the dielectric material 46 may include multiple dielectric layers, and a part of one dielectric layer in the dielectric material 46 (such as the bottommost dielectric layer) may be used as the first dielectric layer DL1. In some embodiments, an interconnection structure (not illustrated) may be disposed on the dielectric material 45, the manufacturing process of the first electrode BE, the patterned conductive layer 34P, and/or the second electrode TE in the capacitor unit CP may be integrated with that of the interconnection structure for process simplification and/or reducing the influence of the area occupied by the capacitor unit CP, and the manufacturing process of the capacitor unit CP may be regarded as being integrated with the back end of line (BEOL) process, but not limited thereto. In addition, the capacitor unit CP in the capacitor structure shown in FIG. 9 and the capacitor unit CP in the capacitor structure shown in FIG. 10 may be regarded as being integrated with the front end of line (FEOL) process, but not limited thereto.

To summarize the above descriptions, according to the capacitor structure and the manufacturing method thereof in the present invention, the dielectric layer and the patterned conductive layer may be disposed between the first electrode and the second electrode of the capacitor unit, and the dielectric layer surrounds the patterned conductive layer for simplifying related manufacturing processes of the capacitor unit and improving the process integration between the capacitor unit and other semiconductor units.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
   an insulation layer; and
   a capacitor unit disposed on the insulation layer, wherein the capacitor unit comprises:
   a first electrode;
   a second electrode disposed above the first electrode in a vertical direction;
   a first dielectric layer disposed between the first electrode and the second electrode in the vertical direction;
   a patterned conductive layer disposed between first electrode and the second electrode, wherein the patterned conductive layer is electrically connected with the first electrode, and the first dielectric layer surrounds the patterned conductive layer in a horizontal direction; and
   an opening disposed above the patterned conductive layer and penetrating through the second electrode in the vertical direction, wherein the opening is directly connected with the second electrode and the patterned conductive layer.

2. The capacitor structure according to claim 1, wherein a material composition of the patterned conductive layer is different from a material composition of the first electrode and a material composition of the second electrode.

3. The capacitor structure according to claim 1, wherein the patterned conductive layer comprises aluminum.

4. The capacitor structure according to claim 1, wherein the patterned conductive layer is directly connected with the first electrode, and the patterned conductive layer is separated from the second electrode.

5. The capacitor structure according to claim 1, further comprising:
   a contact structure partly disposed in the opening and electrically connected with the first electrode via the patterned conductive layer.

6. The capacitor structure according to claim 1, further comprising:
   a second dielectric layer disposed on the insulation layer and covering the capacitor unit, wherein a material composition of the second dielectric layer is identical to a material composition of the first dielectric layer.

7. The capacitor structure according to claim 6, wherein the first dielectric layer is a first portion of a dielectric material, the second dielectric layer is a second portion of the dielectric material, and the second portion is directly connected with the first portion.

8. The capacitor structure according to claim 1, wherein the horizontal direction and the vertical direction are orthogonal.

9. The capacitor structure according to claim 1, further comprising:
   a III-V compound layer, wherein the insulation layer is disposed on the III-V compound layer.

10. The capacitor structure according to claim 1, wherein a center point of a projection area of the first electrode in the vertical direction overlaps the patterned conductive layer when the capacitor structure is viewed in the vertical direction.

* * * * *